(12) United States Patent
Kao

(10) Patent No.: US 10,481,190 B2
(45) Date of Patent: Nov. 19, 2019

(54) TEST DEVICE WITH A BUILT-IN TEST ANTENNA

(71) Applicant: UNIVERSAL SCIENTIFIC INDUSTRIAL ( SHANGHAI ) CO., LTD., Shanghai (CN)

(72) Inventor: Ho-Chu Kao, Shanghai (CN)

(73) Assignee: UNIVERSAL SCIENTIFIC INDUSTRIAL (SHANGHAI) CO., LTD., Shanghai (CN)

( * ) Notice: Subject to any disclaimer, the term of this patent is extended or adjusted under 35 U.S.C. 154(b) by 136 days.

(21) Appl. No.: 15/829,853

(22) Filed: Dec. 1, 2017

(65) Prior Publication Data

US 2019/0113556 A1     Apr. 18, 2019

(30) Foreign Application Priority Data

Oct. 13, 2017   (CN) .......................... 2017 1 0954495

(51) Int. Cl.
  *G01R 29/10*   (2006.01)
  *H01Q 1/12*   (2006.01)
  *H01Q 1/38*   (2006.01)
(52) U.S. Cl.
  CPC ............ *G01R 29/10* (2013.01); *H01Q 1/12* (2013.01); *H01Q 1/1207* (2013.01); *H01Q 1/38* (2013.01)
(58) Field of Classification Search
  CPC ............... G01R 29/10; G01R 31/2822; H04B 17/10–17/12
  See application file for complete search history.

(56) References Cited

U.S. PATENT DOCUMENTS

| 2017/0102409 | A1* | 4/2017 | Sarhad | .................... G01R 1/045 |
| 2017/0279491 | A1* | 9/2017 | Lam | .......................... H04B 3/46 |
| 2018/0003754 | A1* | 1/2018 | Schrattenecker | ...... G01R 29/10 |

FOREIGN PATENT DOCUMENTS

| CN | 1566970 A | 1/2005 |
| CN | 104935386 A | 9/2015 |
| CN | 205212845 U | 5/2016 |
| CN | 106053967 A | 10/2016 |
| CN | 107046428 A | 8/2017 |
| WO | WO 2006/054762 A1 | 5/2006 |
| WO | WO 2015/139466 A1 | 9/2015 |

* cited by examiner

*Primary Examiner* — Dameon E Levi
*Assistant Examiner* — Hasan Z Islam
(74) *Attorney, Agent, or Firm* — Li & Cai Intellectual Property (USA) Office

(57) ABSTRACT

A test device with a built-in test antenna is provided. The test device is applicable to a device under test having an antenna under test. The test device with a built-in test antenna includes: a test base board, a test socket, and an antenna assembly. The test base board is electrically connected to a test apparatus. The test socket is disposed on the test base board. The device under test is to be disposed on the test socket. The antenna assembly includes a test antenna and an antenna board. The antenna assembly is disposed inside the test socket so as to be coupled to the test antenna. The antenna board is electrically connected to the test base board, and the position of the test antenna corresponds to that of the antenna under test.

10 Claims, 5 Drawing Sheets

TEST DEVICE WITH A BUILT-IN TEST ANTENNA

BACKGROUND OF THE INVENTION

1. Field of the Invention

The present disclosure relates to a test device; more particularly, to a test device with a built-in test antenna.

2. Description of Related Art

Products with a built-in antenna are tested before being made available on the market. In the prior art, the testing of a device with a built-in antenna is done using a test device, which is operated as follows. First, the device under test is disposed in a test device, and then a plunger with a test antenna and a radio-frequency connector moves towards the test device and presses the device under test such that the test antenna is coupled to the antenna of the device under test. Lastly, a test apparatus retrieves the test data via the radio-frequency connector.

However, frequent back-and-forth movement of the plunger causes entanglement, displacement, or even detachment of the cables connected between the radio-frequency connector and the test apparatus. Furthermore, when replacing the device under test with another device under test of a new design, the radio-frequency connector, the test antenna and the circuitry for the test apparatus have to be redesigned as well, raising the production cost.

Moreover, since the plunger and the test device are made of different materials, the frequency shifts of the antenna under test and the test antenna caused by environmental interference are different. Therefore, apart from the coupling distance between the test antenna and the antenna under test, the frequency shift effect caused by the plunger and the test device also needs to be taken into consideration when conducting antenna testing. In view of the above-mentioned problems, the antenna testing devices of the prior art need to be improved.

SUMMARY OF THE INVENTION

The main object of the present disclosure is to provide a test device with a built-in test antenna, which solves the problems in the prior art caused by the back-and-forth movement of the radio-frequency connector, thereby enhancing the testing efficiency of antenna testing.

In order to achieve the aforementioned objects, the present disclosure provides a test device with a built-in test antenna for testing a device under test having an antenna under test. The test device includes a test board, a test socket and an antenna assembly. The test board is electrically connected to a test apparatus. The test socket is disposed on the test base board for carrying the device under test. The antenna assembly includes a test antenna and an antenna board, in which the antenna assembly is disposed inside the test socket so as to be coupled to the antenna under test.

The present disclosure is advantageous in that, through the technical structure of the antenna assembly being built inside the test socket, and the position of the test antenna corresponding to that of the antenna under test, the test antenna and the antenna under test can be coupled to each other in the test socket.

In order to further the understanding of the present disclosure, the following embodiments are provided along with illustrations to facilitate the disclosure of the present disclosure.

DETAILED DESCRIPTION OF THE PREFERRED EMBODIMENTS

The aforementioned illustrations and following detailed description are exemplary for the purpose of further explaining the scope of the present disclosure. Other objectives and advantages related to the present disclosure will be illustrated in the following description and appended drawings.

It should be understood that terms such as "the first", "the second" and "the third" may be used to represent the components of the present disclosure; however, these terms are used to help distinguish one component from another, and are not limitations to the components. Furthermore, the term "or" indicates the named components either individually or as any possible combinations thereof.

Figure 2:
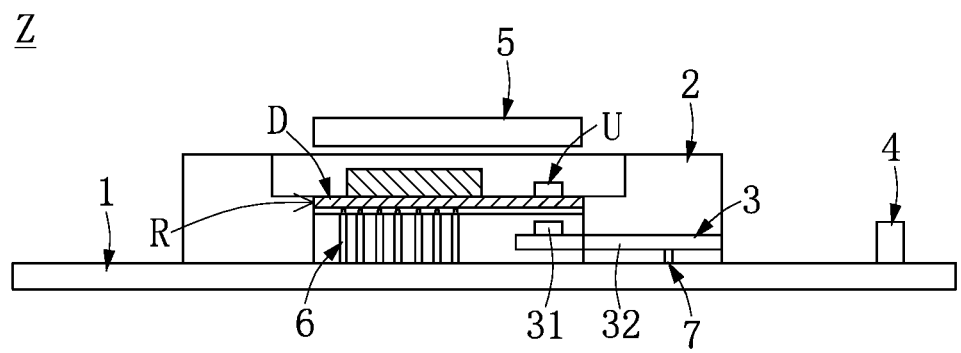
FIG. 2 is a schematic view illustrating a test device with a built-in test antenna carrying a device under test according to an embodiment of the present disclosure.

Referring to FIGS. 2 to 6B, the present disclosure provides a test device Z with a built-in antenna. The test device Z is used for testing a device under test D with an antenna under test U. The test device Z includes a test board 1, a test socket 2, and an antenna assembly 3. The test board 1 is electrically connected to a test apparatus (not shown in the drawings). The test socket 2 is disposed on the test board 1 so as to carry the device under test D. More specifically, the test socket 2 includes a device-under-test accommodating space R that receives the device under test D, as shown in FIGS. 2, 4A and 5A.

Figure 6A:
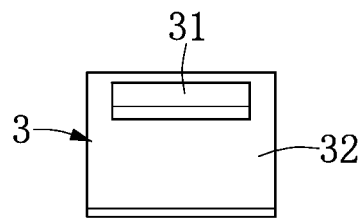
FIG. 6A is a top view illustrating the antenna assembly according to the embodiment of the present disclosure.
Figure 6B:
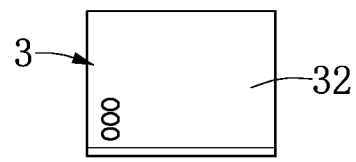
FIG. 6B is a bottom view illustrating the antenna assembly according to the embodiment of the present disclosure.

With reference to FIGS. 6a and 6b, the antenna assembly 3 includes a test antenna 31 and an antenna board 32. The antenna assembly 3 is built inside the test socket 2 so as to be coupled to the antenna under test U. Furthermore, the antenna board 32 is electrically connected to the test board 1, and the position of the test antenna 31 corresponds to that of the antenna under test U.

Moreover, with reference to FIG. 2, the test device Z further includes a radio-frequency connector 4 disposed on the test board 1, in which the test board 1 is electrically connected to the test apparatus (not shown in the drawings) through the radio-frequency connector 4. By coupling the test antenna 31 to the antenna under test U and outputting testing signals to the test apparatus (not shown in the drawings) through the radio-frequency connector 4, the test apparatus can analyze the antenna performance of the device under test D. More specifically, the test antenna 31 is disposed inside the test socket 2 in a manner such that the test antenna 31 is coupled to the antenna under test U in the test socket 2.

Figure 3:
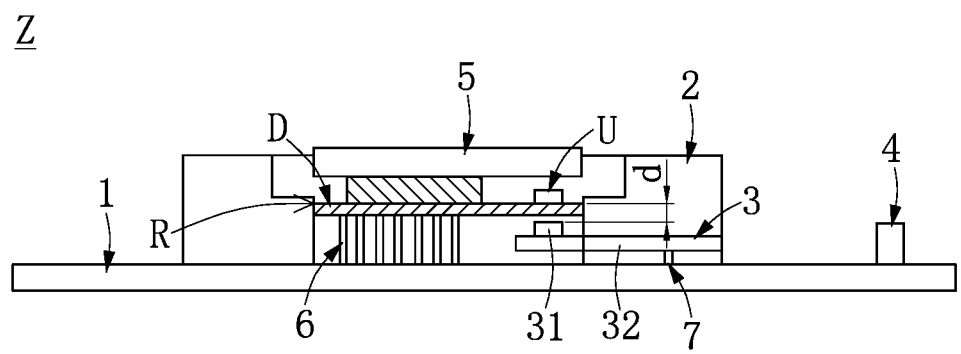
FIG. 3 is a schematic view illustrating the test device of FIG. 2 carrying a device under test that is being pressed by a plunger.
Figure 4A:
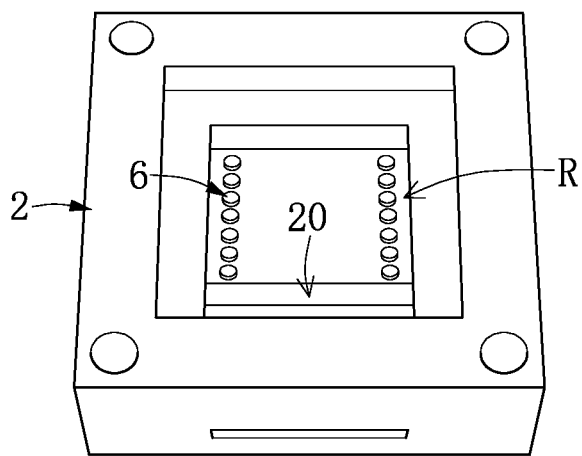
FIG. 4A is a top view illustrating a test socket according to the embodiment of the present disclosure.
Figure 4B:
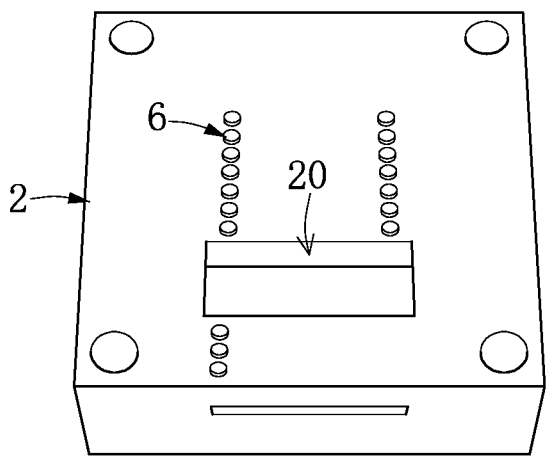
FIG. 4B is a bottom view illustrating the test socket according to the embodiment of the present disclosure.

Furthermore, referring to FIG. 3 along with FIG. 2, in the present embodiment, the device under test D is pressed downward by a plunger 5 located above the test socket 2 so as to form electrical connection between the device under test D and the test base board 1, in which the antenna under test U and the test antenna 31 are spaced apart by a predetermined distance d. More specifically, the antenna board 32 is already in electrical connection with the test board 1 before the plunger 5 press downward, and the plunger 5 serves to form electrical connection between the device under test D and the test board 1.

Figure 1:
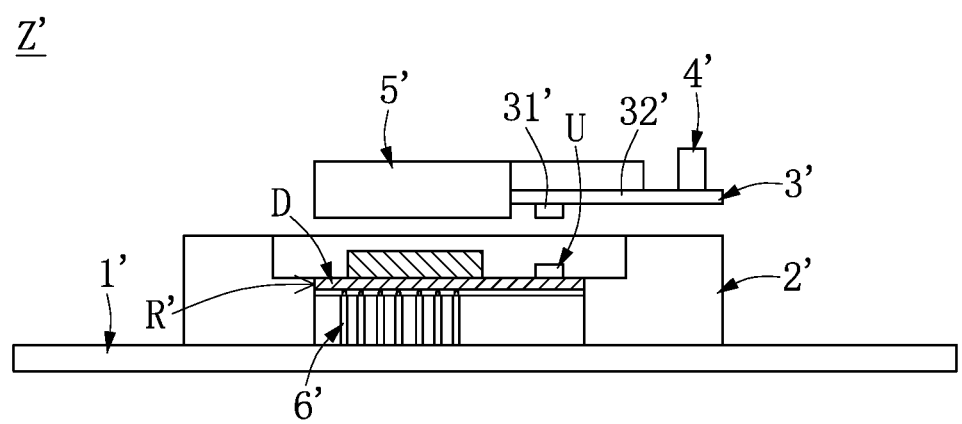
FIG. 1 is schematic view illustrating a conventional test device for testing a device with an antenna.

Referring to FIG. 1, in the prior art, the antenna assembly 3' is disposed on the plunger 5', and when the plunger 5' presses the device under test D downwardly, the test antenna 31' of the antenna assembly 3' is brought near the antenna under test U and coupled thereto, and the test data will be outputted to the test apparatus (not shown in the drawings) through the radio-frequency connector 4', in which the device under test D is in electrical connection with the test board 1'. One of the advantages of the present embodiment compared to the prior art, which is shown in FIG. 2 and FIG. 3, is that the test antenna 31 of the present disclosure is embedded in the test socket 2, and when the plunger 5' presses the device under test D to the fullest extent, the test antenna 31 and the antenna under test U are spaced apart by a predetermined coupling distance d. In this way, errors caused by movements of the plunger 5 can be prevented, and the derived test data becomes more accurate than that of the prior art.

In addition, the radio-frequency connector 4' of the test device in the prior art is disposed on the test antenna 31' and therefore moves along with the plunger 5' (or with the test antenna 31'), which causes the cables (not shown in the drawings) connected between the radio-frequency connector 4' and the test apparatus (not shown in the drawings) to get tangled, displaced or even fall off, whereas in the present embodiment, the radio-frequency connector 4 is disposed on the test board 1 and thus will not move along with the plunger 5, solving the problems in the prior art in which the cables get tangled, displaced or fall off easily.

The way the test socket 2 and the antenna board 32 connected to the test board 1 is not limited in the present disclosure. In the present embodiment, the test socket 2 and the antenna board 32 are respectively connected to the test board 1 through pogo pins. However, the present disclosure is not limited thereto.

More specifically, with reference to FIGS. 4A to 5B, the test socket 2 of the present disclosure further includes at least one first test probe 6, through which the device under test D is electrically connected to the test board 1 when the device under test D is pressed by the plunger 5 towards the test board 1. Moreover, the test socket 2 further includes at least one second test probe 7, through which the antenna board 32 of the antenna assembly 3 is electrically connected to the test board 1.

Figure 5A:
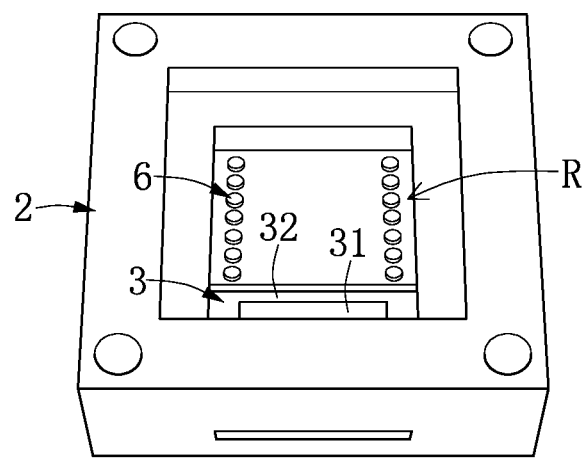
FIG. 5A is a top view illustrating the test socket and an antenna assembly built inside the test socket.
Figure 5B:
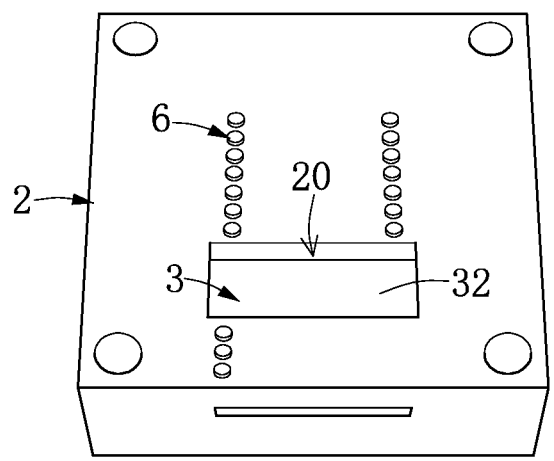
FIG. 5B is a bottom view illustrating the test socket and the antenna assembly built inside the test socket.

With reference to FIGS. 2, 5A, and 5B, the position of the test antenna 31 corresponds to that of the antenna under test U in a manner such that the test antenna 31 is coupled to the antenna under test U. Specifically, in the present disclosure, the antenna assembly 3 is fixed to the test socket 2 via threaded connections (for example exemplified as screws, which are not shown in the drawings), in which the position of the test antenna 31 corresponds to the clearance area 20 of the test socket 2. When the device under test D is positioned in the test socket 2, the test antenna 31 is located between the antenna under test U and the test board 1. However, the present disclosure is not limited thereto.

Moreover, in the present embodiment, the device under test D is a system-in-package module, and the operating frequency of the antenna under test U ranges from 2400 MHz to 6000 MHz. With reference to US Patent No. 2017/0102409A1, a technical solution of the prior art provides an antenna test device, in which a waveguide is embedded in the test socket so as to be coupled with the antenna under test. The difference between the present disclosure and the above-mentioned technical solution is that the waveguide transmits EHF (extremely high frequency) signals to the test apparatus via the air, while the antenna assembly 3 of the present disclosure receives high frequency signals ranged between UHF (ultra-high frequency) and SHF (super high frequency), which is then transferred to the test board 1, and then to the test apparatus via the radio-frequency connector 4. In addition, the technical solution of utilizing waveguides as transmitters is not applicable to antenna operating at ultra-high frequencies (300 MHz to 3 GHz) in view of the fact that the size of the waveguide depends on the signal frequencies. For instance, to transmit Bluetooth signals at 2.4 GHz, a waveguide with a cross-sectional area of 109.22 mm×54.61 mm is required. However, a waveguide with such cross-sectional area would be incompatible with a test socket.

More specifically, the antenna under test U and the test antenna 31 of the present disclosure are both chip antennas or are both print antennas; however, the present disclosure is not limited thereto. Specifically, since the antenna assembly 3 is built inside the test socket 2 of the test device Z, the antenna under test U and the test antenna 31 are in the same test environment, resulting in the same frequency shift. By the structural means of the present disclosure, when the antenna under test U is a chip antenna, the test antenna 31 can be a chip antenna with approximately the same structure as the antenna under test U except for slight adjustments in accordance with a predetermined coupling distance. Similarly, when the antenna under test U is a print antenna, the test antenna 31 can be a print antenna with about the same structure. In this way, the cost of testing can be reduced, and the testing efficiency and accuracy can be enhanced.

In summary, the test device Z of the present disclosure has a built-in test antenna 31 located inside the test socket 2 such that the relative position between the test antenna 31 and the antenna under test U can be fixed, which enhances the testing efficiency and accuracy. In addition, the radio-frequency connector 4 of the present disclosure is disposed on the test board 1 and thus the cables (not shown in the drawings) connected between the radio-frequency connector 4 and the test apparatus (not shown in the drawings) are not drawn by and do not move with the plunger when the plunger is operating, which solves the problems in the prior art in which the cables get tangled, displaced or fall off easily. Moreover, since the antenna under test U and the test antenna 31 are both in the test socket 2 when a testing is performed, i.e. the antenna under test U and the test antenna 31 are in the same test environment, the amount of frequency shifts of the antenna under test U and the test antenna 31 are approximately the same and thus are mutually offset. In this way, the production cost of the test antenna 31 can be reduced and the test data is more accurate.

The present disclosure is advantageous in that, through the technical structure of the antenna assembly 3 being built inside the test socket 2, and the position of the test antenna 31 corresponding to that of the antenna under test U, the test antenna 31 and the antenna under test U can be coupled to each other in the test socket 2.

The description illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A test device with a built-in test antenna for testing a device under test having an antenna under test, the test device comprising:
   a test board electrically connected to a test apparatus;
   a test socket disposed on the test board for carrying the device under test;
   an antenna assembly including a test antenna and an antenna board, the antenna assembly being disposed inside the test socket so as to be coupled to the antenna under test;
   wherein the antenna board is electrically connected to the test board, and the position of the test antenna corresponds to that of the antenna under test.

2. The test device according to claim 1, further comprising: a radio frequency connector disposed on the test board, the test board being electrically connected to the test apparatus through the radio frequency connector.

3. The test device according to claim 1, wherein the device under test is pressed by a plunger located above such that the device under test is electrically connected to the test board, wherein the antenna under test and the test antenna are spaced apart by a predetermined coupling distance.

4. The test device according to claim 3, wherein the test socket further includes at least one first test probe, through which the device under test is electrically connected to the test board, wherein when the plunger presses the device under test towards the test board, the device under test is electrically connected to the test board through the at least one first test probe.

5. The test device according to claim 3, further comprising at least one second test probe, wherein the antenna board of the antenna assembly is electrically connected to the test board through the at least one second test probe.

6. The test device according to claim 1, wherein the test antenna is located between the antenna under test and the test board.

7. The test device according to claim 1, wherein the device under test is a system-in-package module.

8. The test device according to claim 1, wherein the operating frequency of the antenna under test ranges from 2400 MHz to 6000 MHz.

9. The test device according to claim 1, wherein the antenna under test and the test antenna are chip antennas.

10. The test device according to claim 1, wherein the antenna under test and the test antenna are print antennas.

* * * * *